United States Patent
Speier et al.

(10) Patent No.: US 10,234,525 B2
(45) Date of Patent: Mar. 19, 2019

(54) METHOD AND MAGNETIC RESONANCE APPARATUS FOR ACQUIRING MR DATA FROM MULTIPLE SLICES SIMULTANEOUSLY

(71) Applicant: Siemens Healthcare GmbH, Erlangen (DE)

(72) Inventors: Peter Speier, Erlangen (DE); Daniel Staeb, Memmingen (DE)

(73) Assignees: Julius-Maximilians-Universitaet-Wuerzburg, Wuerzburg (DE); Siemens Healthcare GmbH, Erlangen (DE)

( * ) Notice: Subject to any disclaimer, the term of this patent is extended or adjusted under 35 U.S.C. 154(b) by 97 days.

(21) Appl. No.: 15/367,492

(22) Filed: Dec. 2, 2016

(65) Prior Publication Data

US 2017/0227618 A1    Aug. 10, 2017

(30) Foreign Application Priority Data

Dec. 2, 2015  (DE) .......................... 10 2015 224 054

(51) Int. Cl.
  *G01R 33/483*  (2006.01)
  *G01R 33/561*  (2006.01)

(52) U.S. Cl.
  CPC ..... *G01R 33/4835* (2013.01); *G01R 33/5617* (2013.01)

(58) Field of Classification Search
  CPC ............ G01R 33/4835; G01R 33/5617; G01R 33/5616; G01R 33/5615; G01R 33/5613; G01R 33/5614
  See application file for complete search history.

(56) References Cited

U.S. PATENT DOCUMENTS

| 5,909,119 A | 6/1999 | Zhang et al. |
| 2002/0042567 A1 | 4/2002 | Heid |

(Continued)

FOREIGN PATENT DOCUMENTS

| DE | 102008039203 A1 | 2/2010 |
| DE | 102014202358 A1 | 8/2015 |

OTHER PUBLICATIONS

Martin et al., "Accelerated Multiband SSFP Imaging with Controlled Aliasing in Parallel Imaging and integrated-SSFP (CAIPI-iSSFP)," Proc. Intl. Soc. Mag. Reson. Med., vol. 23, p. 3640 (2015).

(Continued)

*Primary Examiner* — Rishi R Patel
(74) *Attorney, Agent, or Firm* — Schiff Hardin LLP

(57) ABSTRACT

In a method and apparatus for acquiring magnetic resonance (MR) data from a predetermined volume within an examination object, a control protocol for a gradient echo sequence is selected that specifies that gradient moments produced in said gradient echo sequence be balanced along all three spatial directions. In this gradient echo sequence a slice selection gradient is activated in a slice selection direction that produces a balanced gradient moment, with simultaneous radiation of an RF pulse that simultaneously excites nuclear spins in multiple slices of the examination object, with said excitation being repeated according to a repetition time. A phase of MR signals to be acquired from a same one of said multiple layers is varied from repetition time-to-repetition time. An additional gradient is activated in the slice selection gradient that produces an additional gradient moment that is constant over consecutive repetition times and thus overrides the condition of the gradient moments of the gradient echo sequence being balanced along said slice selection direction. The MR signals are acquired during activation of a readout gradient.

14 Claims, 7 Drawing Sheets

(56) References Cited

U.S. PATENT DOCUMENTS

| | | | |
|---|---|---|---|
| 2003/0060697 A1 | 3/2003 | Zhang et al. | |
| 2005/0258829 A1* | 11/2005 | Bieri | G01R 33/5613 |
| | | | 324/307 |
| 2008/0061779 A1 | 3/2008 | Feiweier | |
| 2010/0283465 A1 | 11/2010 | Hurd | |
| 2012/0249138 A1 | 10/2012 | Pfeuffer | |
| 2012/0286777 A1 | 11/2012 | Frost et al. | |
| 2013/0033263 A1 | 2/2013 | Fautz et al. | |
| 2013/0088228 A1 | 4/2013 | Feiweier et al. | |
| 2013/0257429 A1 | 10/2013 | Edelman | |
| 2013/0271128 A1 | 10/2013 | Duerk et al. | |
| 2013/0285656 A1 | 10/2013 | Feiweier | |
| 2014/0043026 A1 | 2/2014 | Frahm et al. | |
| 2015/0226823 A1 | 8/2015 | Speier | |
| 2015/0260820 A1* | 9/2015 | Speier | G01R 33/4835 |
| | | | 324/309 |

OTHER PUBLICATIONS

Haacke et al., "Steady-State Free Precession Imaging in the Presence of Motion: Application for Improved Visualization of the Cerebrospinal Fluid", Radiology, vol. 175, pp. 545-552 (1990).

Larkman et al., "Use of Multicoil Arrays for Separation of Signal from Multiple Slices Simultaneously Excited," Journal of Magnetic Resonance Imaging, vol. 13, pp. 313-317 (2001).

Stäb et al., "CAIPIRINHA Accelerated SSFP Imaging," Magnetic Resonance in Medicine, vol. 65, pp. 157-164 (2011).

Bieri et al., "Analysis and Compensation of Eddy Currents in Balanced SSFP," Magnetic Resonance in Medicine, vol. 54, pp. 129-137 (2005).

Setsompop et al., "Blipped-Controlled Aliasing in Parallel Imaging for Simultaneous Multislice Echo Planar Imaging With Reduced g-Factor Penalty," Magnetic Resonance in Medicine, vol. 67, pp. 1210-1224 (2012).

Breuer et al., "Controlled Aliasing in Parallel Imaging Results in Higher Acceleration (CAIPIRINHA) for Multi-Slice Imaging," Magnetic Resonance in Medicine, vol. 53, pp. 684-691 (2005).

* cited by examiner

METHOD AND MAGNETIC RESONANCE APPARATUS FOR ACQUIRING MR DATA FROM MULTIPLE SLICES SIMULTANEOUSLY

BACKGROUND OF THE INVENTION

Field of the Invention

The present invention concerns the use of a modified TrueFISP sequence, in order to capture MR data simultaneously from multiple slices of a subject. In this case, a TrueFISP sequence is understood to mean a sequence for operating a magnetic resonance installation that produces gradient moments that are balanced along all three spatial axes.

Description of the Prior Art

MR raw data capture (acquisition) using a TrueFISP sequence (True Fast Imaging with Steady State Precession) is characterized by a very high signal to noise ratio and high speed. In order to increase the speed further, parallel data capture is required, in which raw data from at least two slices are captured simultaneously.

The manner by which an MR data acquisition scanner is operated in order to execute such a data acquisition sequence (or any MR data acquisition sequence) is defined by an associated control protocol that specifies, for the scanner, the sequence execution.

In the case of parallel data capture, it is necessary to solve the problem of proportionally assigning the received MR signals to the various simultaneously excited slices. One method that assists this assignment or signal separation over the various slices is the so-called CAIPIRINHA method ("Controlled Aliasing in Parallel Imaging Results in Higher Acceleration for Multi-Slice Imaging", Magn. Reson. Med. 2005; 53 (3), F. A. Breuer et al., pages 684-691).

A further known method that assists this assignment or signal separation over the various slices is described in US 2013/0271128 A1.

The means by which this CAIPIRINHA method can be modified such that it can also be used for TrueFISP sequences can be found in "CAIPIRINHA accelerated SSFP imaging", Magn. Reson. Med. 2011; 65, D. Stäb et al., pages 157-164, for example.

In this modified CAIPIRINHA method, provision is first made for varying the phase of consecutive RF excitations of the same slice. Secondly, the phases of the simultaneously occurring RF excitations of the slices to be captured simultaneously are shifted relative to each other. When capturing the MR data from a slice S0 and a slice S1, the phase $P_{S0}$ of the RF excitations of the slice S0 can satisfy e.g. the following equation (1), while the phase Psi of the RF excitations of the slice S1 can satisfy e.g. the following equation (2).

$$P_{S0} = -k*90° \quad (1)$$

$$P_{S1} = +k*90° \quad (2),$$

where k designates the running index, i.e. the phase $P_{S0}$ or $P_{S1}$ changes from repetition time-to-repetition time by a phase increment of −90° or +90° respectively. The difference in the phase increments would therefore be 180° in this case.

FIG. 1 illustrates the frequency bands of the two slices S0 and S1 to be captured simultaneously. The operational signs within the frequency bands indicate whether the amplitude of the captured MR signals is positive or negative. The reference sign 31 designates the dark bands.

It can be seen from FIG. 1 that the modified CAIPIRINHA method shifts the band structure of the two slices S0, S1 by ¼ of the bandwidth in each case, the band structure of the slice S0 being shifted by +90° and the band structure of the slice S1 by −90° relative to the band center (0°). As a result, the effective bandwidth 32 for both slices S0, S1 is reduced by approximately 50% in comparison with the bandwidth for only one of the slices.

SUMMARY OF THE INVENTION

An object of the invention is to provide a method and apparatus for parallel MR data capture using a TrueFISP sequence, wherein the effective bandwidth is greater than in the modified CAIPIRINHA method described above.

In the context of the present invention, a method is provided for capturing MR signals of a predefined volume section within an examination object by operation of the scanner of a magnetic resonance installation, wherein a gradient echo sequence is used. The method has the following steps.

In the method, a slice selection gradient is activated in a slice selection direction. In this case, the slice selection gradient produces a gradient moment that is balanced (i.e. the gradient moment over a repetition time is 0).

Simultaneously with the activation of the slice selection gradient, two (or more) slices of the volume section are excited using RF excitation, or an RF excitation pulse that has a number of (in particular separated) frequency bands (one frequency band per slice to be excited, and one RF excitation or one RF excitation pulse per repetition time). This multi-band RF excitation pulse may be composed of, for example, a number of RF excitation pulses (one RF excitation pulse per slice and repetition time) which are superimposed when applied. This means that the applied RF waveform by which the slices are simultaneously excited corresponds to a superimposition of the RF excitation pulses.

In the method, the phase of MR signals to be captured from the same slice is varied from repetition time-to-repetition time. By this step, the phase of the MR signals to be captured from at least one of the slices to be captured is changed, such that these MR signals of the respective slice have a first phase during a first repetition time and a second phase, which is not identical to the first phase, during a second repetition time that immediately follows the first repetition time. This applies to all repetition times, such that the phases for temporally adjacent repetition times of the slice are never identical.

In this case, the variation of the phase of the MR signals to be captured means that a property of the sequence that is used is varied (and not e.g. a property of the currently sampled k-space row). In other words, parameters of the gradient echo sequence are changed from repetition time-to-repetition time such that, even if the same k-space row is read out at a first repetition time using first parameters of the sequence, and then the same k-space row is read out at a second repetition time directly following the first repetition time and using second parameters of the sequence, the phase of the captured MR signals during the first repetition time differs from the phase of the captured MR signals during the second repetition time. The manner in which this variation of the phase is realized is described below in various embodiments.

The variation of the phase of the MR signals from repetition time-to-repetition time (or from k-space row to k-space row) allows (or assists) the division of the captured MR signal portions over the slices to be captured simultaneously. This variation of the phase of the MR signals typically produces a shift in phase coding direction. During the reconstruction, this shift can be reversed or taken into consideration for the respective slice.

Further in the method, an additional gradient in the slice selection direction is activated in addition to the aforementioned slice selection gradient. The additional gradient produces an additional gradient moment which is constant over consecutive repetition times. This means that the additional gradient moment of a first repetition time corresponds to the additional gradient moment of a second repetition time which directly follows the first repetition time. This applies in particular to all repetition times which must be captured for the purpose of capturing all MR signals of the slices to be captured simultaneously, and therefore the additional gradient moment is equal in size for all of these repetition times.

The MR image data are acquired during the activation of a readout gradient and are made available in electronic form as a data file.

Without taking the additional gradient into consideration, the gradient moments produced by the gradient echo sequence would be balanced along all three spatial directions during each repetition time (in particular from RF excitation pulse midpoint to RF excitation pulse midpoint), because that is what is specified by the control protocol for a gradient echo sequence. The gradient echo sequence according to the invention can, therefore, be referred to as a type of TrueFISP sequence.

The activation of the additional gradient in the slice direction in accordance with the invention, however, overrides the specification in the gradient echo sequence control protocol that the gradient moments in all these spatial directions each be balanced.

As a result of producing the additional gradient moment, it is possible to set the Larmor frequency appropriately independently for each slice (more precisely: for each slice to be captured simultaneously). Therefore the band structures of the slices to be captured simultaneously (see FIG. 1) can be adapted to each other or shifted relative to each other, in order to increase the effective bandwidth.

In other words, when reading out the MR data, the phase of the captured spins from a slice is determined only by the RF phase cycle in this slice and not by its position in the band structure. The phase of the captured spins is again dependent on the difference in the local Larmor frequencies of the slices. The difference in the local Larmor frequencies is influenced by the additional gradient moment, and therefore by selecting this additional gradient moment, the band structures of the slices to be captured simultaneously appropriately can be shifted relative to each other, in order thereby positively to influence the readout bandwidth (usually to increase it).

In particular, the additional gradient is constant in this case. This means that the additional gradient constantly has the same amplitude during the capture of the MR signals of the slices to be captured simultaneously.

The constant additional gradient can be produced by a shim component or assembly of the magnetic resonance installation, for example, such that the actual sequence (and hence the sequence controller) can remain unaffected thereby.

It is also possible to activate the additional gradient (only) before the RF excitation pulses, or (only) after the RF excitation pulses, or (only) before and after the RF excitation pulses. This means that the additional gradient is not activated during the RF excitation pulse or during the readout of the MR signals.

Since an additional gradient that is continuously present can disrupt the slice selection and the readout of the MR signals, it can be advantageous to activate the additional gradient during the prephaser period and/or rephaser period only.

The profile of the additional gradient is constant over consecutive repetition times in this case. In other words, the profile of the additional gradient over the time during one repetition time corresponds to the profile of the additional gradient over the time during another repetition time, and therefore the profile of the additional gradient over the time can be identical for all repetition times of the slices to be captured simultaneously.

The setting of a constant or identical profile of the additional gradient over consecutive repetition times assists the required production of the constant additional gradient moment over consecutive repetition times.

In this case, the additional gradient moment is advantageously dependent on a distance between the slices to be simultaneously excited, or dependent on the difference in the phase increment of the RF excitation pulses of the slices to be excited simultaneously, or dependent on both the distance between the slices to be excited simultaneously and the difference in the phase increment of the RF excitation pulses of the slices to be excited simultaneously.

In this case, the additional gradient moment should be selected such that, the smaller the distance between the slices to be captured simultaneously, the greater the additional gradient moment, and the greater the difference in the phase increment of the slices to be captured simultaneously, the greater the additional gradient moment.

For example, the additional gradient moment $\Delta M$ can be determined according to the following equation (3):

$$\Delta M = \frac{\Delta P}{\gamma \cdot d} \quad (3)$$

In this case, $\Delta P$ is the difference in the phase increment of the RF excitation pulses of the slices to be captured simultaneously, d is the distance between the slices to be captured simultaneously, and $\gamma$ is the gyromagnetic ratio.

When two slices are to be excited or captured simultaneously, the slice-specific phases of the RF excitation pulses are generally selected such that the fields of view of the two slices to be captured simultaneously (without taking the additional gradient into consideration) overlap by 50%, corresponding to a phase increment difference $\Delta P$ of 180°. In this case (i.e. two slices to be captured simultaneously), the additional gradient is set so as to produce an additional gradient moment $\Delta M$ per repetition time, which can be calculated according to the following equation (4).

$$\Delta M = \frac{180°}{\gamma \cdot d} \quad (4)$$

According to a preferred embodiment, the phase $P_0(k)$ of the RF excitation pulses of a first slice obeys the following equation (5), while the phase $P_1(k)$ of the RF excitation pulses of a second slice, whose MR data is to be captured simultaneously with the MR data of the first slice, obeys the following equation (6).

$$P_0(k) = -k*90° - k*\Phi_G + \Phi_{C0} \quad (5)$$

$$P_1(k) = +k*90° - k*\Phi_G + \Phi_{C1} \quad (6)$$

In this case, k is a running index that starts at 0. The variable $\Phi_{C0}$ designates any chosen constant phase or phase constant in slice S0, and the variable $\Phi_{C1}$ designates any chosen constant phase or phase constant in slice S1. The two variables may be identical or different, and either one or both may be equal to zero. The phase increment $\Phi_G$ is calculated according to the following equation (7).

$$\Phi_G = 90° \cdot \frac{(d0+d1)}{(d0-d1)} \quad (7)$$

In this case, d0 specifies the distance of the first slice in a predefined direction from the isocenter, while d1 specifies the distance of the second slice in the predefined direction from the isocenter. If both slices are the same distance from the isocenter, it applies that d0=−d1 and therefore $\Phi_G$=0°. This means that it is not necessary to consider a phase increment in this case.

If k=3, for example, $P_0(3)=90°-3*\Phi_G$ and $P_1(3)=-90°-3*\Phi_G$. The phase increment difference is 180°, since the term $(-k*\Phi_G)$ is cancelled out when calculating the difference.

In this case, the phase $\Phi_E$ of the receive coil(s) is advantageously selected according to the following equation (8).

$$\Phi_E = X(k) + k*\Phi 0 - k*\Phi_G \quad (8)$$

In this case, it applies that X(k)=0°, if k is an odd number and otherwise X(k)=180°. The phase value $\Phi 0$ is selected as a function of the reconstruction algorithm. An exemplary value for $\Phi 0$ is 90°.

The varying of the phase of the MR signals to be captured is performed simultaneously for each of the slices to be captured. For example, the phases of the MR signals to be captured during two temporally consecutive repetition times are never identical in this case, this applying in particular to each slice.

The varying of the phase of the MR signals to be captured can be achieved in the following ways.

In one variant, a further gradient is established in the slice selection direction before and after the respective RF excitation pulse. In this case, the further gradient moment produced by the further gradient before the respective RF excitation pulse is identical to the further gradient moment produced by the further gradient after the respective RF excitation pulse. In contrast with the additional gradient moment, the further gradient moment varies from repetition time to repetition time, whereby the variation of the phase of the MR signals to be captured is achieved. This procedure is known as "blipped CAIPIRINHA" (see e.g. US 2013/0271128 A1).

In another variant, the phase at which the same slice is excited by the RF excitation pulses is varied. This procedure is known as the CAIPIRINHA method.

When using the blipped CAIPIRINHA method, the polarity of the further gradient moment produced by the further gradient advantageously changes from repetition time to repetition time, wherein the size of the further gradient moment produced per repetition time remains constant.

This polarity change of the further gradient moment requires effective compensation for eddy currents, in order to prevent the eddy current effects accumulating from repetition time-to-repetition time and thereby disrupting the steady state of the spins, which causes image artifacts to be produced.

When using the normal CAIPIRINHA method (varying the phase of the MR signals to be captured), the phase of two consecutive RF excitation pulses of the same slice is advantageously changed for each slice. For example, the phases of two temporally consecutive RF excitation pulses of the same slice are never identical in this case, this applying in particular to each slice to be captured simultaneously.

It should be noted that the two procedures for varying the phase of the MR signals to be captured can be combined. In order to achieve a predefined phase increment difference between slices, for example, one portion of this difference can be produced by one procedure (e.g. CAIPIRINHA) and the remaining portion of this difference produced by the other procedure (e.g. blipped CAIPIRINHA).

The present invention can also be used to capture MR signals from more than two slices simultaneously. Since the inventive additional gradient moment results in a frequency shift which depends proportionally on the distance of the slices, the phase shift produced by the corresponding CAIPIRINHA method must take into consideration the distance of the respectively adjacent slices. In other words, the phase shift produced by the corresponding CAIPIRINHA method between the respectively adjacent slices must be proportional to the distance of these slices. The following relationship therefore applies (9).

$$\Delta PV_{x,y} \sim \Delta FOV_{x,y} \sim d_{x,y} \quad (9).$$

In this case, $\Delta PV_{x,y}$ corresponds to the phase shift produced by the CAIPIRINHA method between the directly adjacent slices x and y, $\Delta FOV_{x,y}$ corresponds to the corresponding shift in the fields of view of the two directly adjacent slices x and y, and $d_{x,y}$ corresponds to the distance between these two slices x and y.

For example, if MR signals from three slices S1, S2, S3 are to be captured simultaneously and the distance $d_{S1,S2}$ between the directly adjacent slices is twice as great as the distance $d_{S2,S3}$ between the two slices S2 and S3, the phase shift $\Delta PV_{S1,S2}$ and the shift in the fields of view $\Delta FOV_{S1,S2}$ between the two slices S1 and S2 should also be twice as large as the phase shift $\Delta PV_{S2,S3}$ and the shift in the fields of view $\Delta FOV_{S2,S3}$ between the two slices S2 and S3.

If three slices are to be captured simultaneously, phase increments of e.g. −120°, 0° and 120° could be used for the RF excitations of the three slices, these being equidistantly arranged. In this case, the fields of view of adjacent slices would be shifted relative to each other by ⅓ of a field of view in each case.

If four or more slices are to be captured simultaneously, the phase increments for the RF excitations of the respective slices can be, for example, 0°, 90°, 180°, 270°, etc. or 0°, 180°, 270°, 90°, etc.

The present invention can also be considered as an improvement of the modified CAIPIRINHA method (see "CAIPIRINHA accelerated SSFP imaging", Magn. Reson. Med. 2011; 65, D. Stab et al., pages 157-164). This modified CAIPIRINHA method is supplemented by the additional gradient in order to increase the effective readout bandwidth in this case.

The present invention also encompasses a magnetic resonance apparatus for capturing MR signals of a volume section of an examination object using a gradient echo sequence. In this case, the gradient echo sequence is a sequence that produces gradient moments that are balanced along all three spatial directions. The magnetic resonance apparatus has a scanner that has a basic field magnet, a gradient field arrangement, one or generally more RF antennas, and a control computer that activates the gradient field apparatus and the RF antenna(s), receives MR signals picked up by the at least one RF antenna, and evaluates these MR signals. The control computer is configured to operate the gradient field arrangement to activate a slice selection gradient in a slice selection direction, the slice selection gradient producing a balanced gradient moment. The control computer is configured to operate the at least one RF antenna to simultaneously excite a number of slices of the volume section with an RF excitation or an RF excitation pulse that is repeated according to a repetition time. The control computer is further configured to vary from repetition time-to-repetition time, the phase of MR signals to be captured from the same one of the slices. The control computer is also configured to operate the gradient field arrangement to establish an additional gradient in a slice selection direction in addition to the aforementioned slice selection gradient. The control computer is configured to operate the gradient field arrangement to activate a readout gradient and capture the MR signals with the readout gradient and the at least one RF antenna, and to make the MR signals available in electronic form as a data file.

In this case, the additional gradient produces an additional gradient moment that is constant over consecutive repetition times. The additional gradient moment contravenes the condition that the gradient moments of the gradient echo sequence are balanced along all three spatial directions.

The advantages of the magnetic resonance apparatus according to the invention correspond to the advantages of the method according to the invention as explained in detail above.

The present invention also encompasses a non-transitory, computer-readable data storage medium encoded with programming instructions (program code) that when the storage medium is loaded into a memory of a programmable controller or computer of a magnetic resonance apparatus, cause the apparatus to be operated so as to implement all or various embodiments of the inventive method as described above when the program code is executed in the controller or control computer of the magnetic resonance apparatus.

The code in this case may be source code (e.g. C++), which then has to be compiled (translated) and linked or only has to be interpreted, or executable software code which merely has to be loaded into the corresponding computing unit or control entity for execution.

The electronically readable data medium can be a DVD, magnetic tape, hard disk or USB stick, on which is stored electronically readable control information, in particular software (cf. above).

The present invention improves CAIPIRINHA methods in the context of parallel MR data capture. The present invention is obviously not limited to this preferred field of application, since the present invention can also be used with variants of the CAIPIRINHA method (e.g. blipped CAIPIRINHA), for example.

DESCRIPTION OF THE PREFERRED EMBODIMENTS

Figure 7:
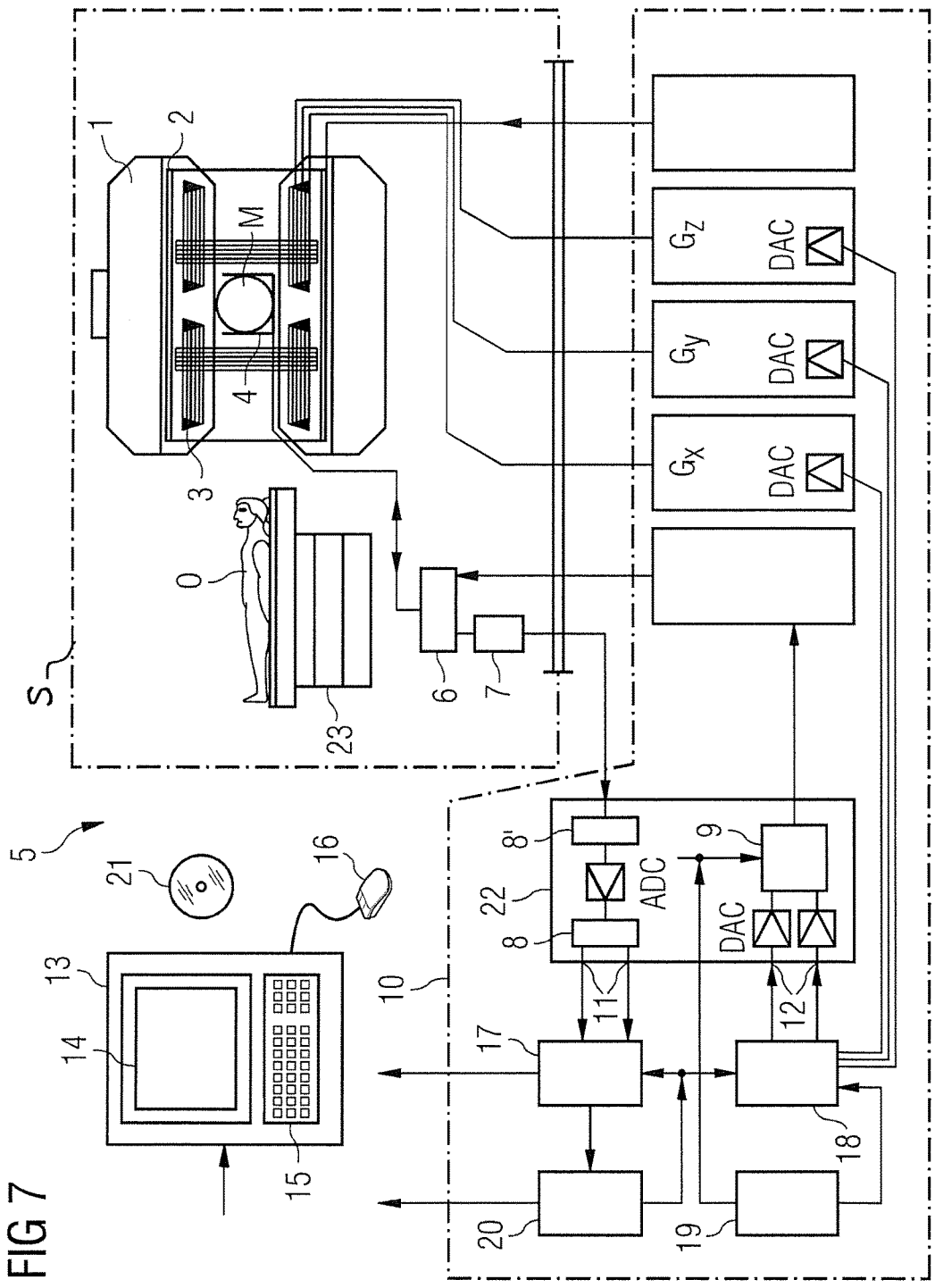
FIG. 7 schematically illustrates a magnetic resonance installation according to the invention.

FIG. 7 is a schematic illustration of a magnetic resonance apparatus 5 according to the invention. A basic field magnet 1 of a scanner S produces a temporally constant, strong magnetic field for polarizing and/or aligning the nuclear spins in an examination region of an object O, e.g. part of a human body to be examined. The object O is examined while lying on a table 23 in the scanner S. The high degree of homogeneity of the basic magnetic field, which is required for the magnetic resonance acquisition, is defined in a typically spherical measuring volume M in which the volume section of the human body to be examined is situated. In order to satisfy the homogeneity requirements and in particular to eliminate temporally invariable influences, shim plates of ferromagnetic material are attached at suitable positions. Temporally variable influences are eliminated by shim coils 2.

A cylindrical gradient coil system 3 composed of three sub-windings is situated in the basic field magnet 1. Each sub-winding is supplied with current by an amplifier for the purpose of producing a linear (and temporally variable) gradient field in a respective direction of a Cartesian coordinate system. The first sub-winding of the gradient coil system 3 produces a gradient $G_x$ in the x-direction, the second sub-winding produces a gradient $G_y$ in the y-direction and the third sub-winding produces a gradient $G_z$ in the z-direction. Each amplifier has a digital-analog converter, which is activated by a sequence controller 18 for the purpose of producing gradient pulses at the correct times.

Situated within the gradient coil system 3 is a radio-frequency antenna 4 (or a number thereof), which converts the radio-frequency pulses provided by a radio-frequency power amplifier into an alternating field that excites certain nuclei so that the nuclear spin thereof in the object O to be examined or a region thereof are deflected out of alignment with the basic magnetic field. Each radio-frequency antenna 4 has one or more RF transmit coils and one or more RF receive coils in an annular arrangement of component coils, the arrangement being preferably linear or in the form of a matrix. The RF receive coils of the respective radio-frequency antenna 4 also convert the alternating field originating from the excited nuclear spins, into a voltage (measured signal), which is supplied via an amplifier 7 to a radio-frequency receive channel 8 of a radio-frequency system 22. In general the magnetic resonance signals are spin echo signals provoked by a pulse sequence composed of one or more radio-frequency pulses and one or more gradient pulses. The radio-frequency system 22, which is part of a control computer 10 of the magnetic resonance apparatus 5, further has a transmit channel 9 in which the radio-frequency pulses for the excitation of magnetic nuclear resonance are produced. The respective radio-frequency pulses in this case are represented digitally as a sequence of complex numbers in the sequence controller 18 on the basis of a pulse sequence specified by the system computer 20. This sequence of numbers is supplied as a real part and an imaginary part via respective inputs 12 to a digital-analog converter in the radio-frequency system 22, and from there to a transmit channel 9. In the transmit channel 9, the pulse sequences are modulated onto a radio-frequency carrier signal having a base frequency that corresponds to the resonance frequency of the nuclear spin in the measuring volume.

The changeover from transmit to receive mode is effected by a transmit/receive diplexer 6. The RF transmit coils of the radio-frequency antenna(s) 4 direct the radio-frequency pulses for exciting the nuclear spin into the measuring volume M, and resulting echo signals are sampled by the RF receive coil(s). The nuclear resonance signals thus obtained are demodulated in a phase-sensitive manner onto an intermediate frequency in the receive channel 8' (first demodulator) of the radio-frequency system 22, digitized in the analog-digital converter (ADC), and output via the output 11. This signal is also demodulated onto the frequency 0. The demodulation onto the frequency 0 and the separation into real and imaginary parts takes place in a second demodulator 8 after digitization in the digital domain. The measured data thus obtained via an output 11 are used by an image processor 17 to reconstruct an MR image. The management of the measured data, the image data and the control programs is performed by the system computer 20. On the basis of control program specifications, the sequence controller 18 checks the production of the currently desired pulse sequences and the corresponding sampling of k-space. In this case, the sequence controller 18 controls the switching of the gradients at the correct time, the emission of the radio-frequency pulses with defined phase amplitudes, and the receipt of the nuclear resonance signals. The time base for the radio-frequency system 22 and the sequence controller 18 is provided by a synthesizer 19. The selection of corresponding control programs for producing an MR image, said programs being stored e.g. on a DVD 21, and the representation of the produced MR image are effected via a terminal 13 having a keyboard 15, a mouse 16 and a display screen 14.

According to the present invention, the sequence controller 18 is configured so as to also switch the additional gradient.

Figure 1:
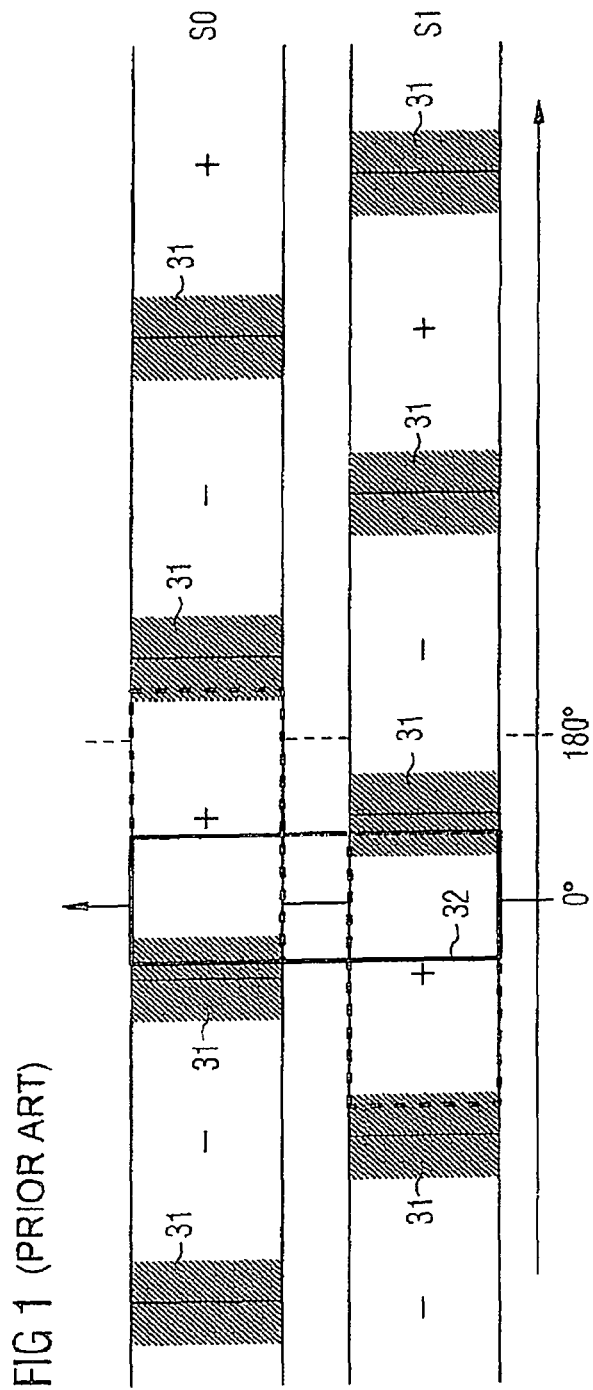
FIG. 1 illustrates the problem to be solved by the invention, in the form of frequency bands of two slices to be captured simultaneously, the frequency bands being shifted relative to each other.
Figure 2:
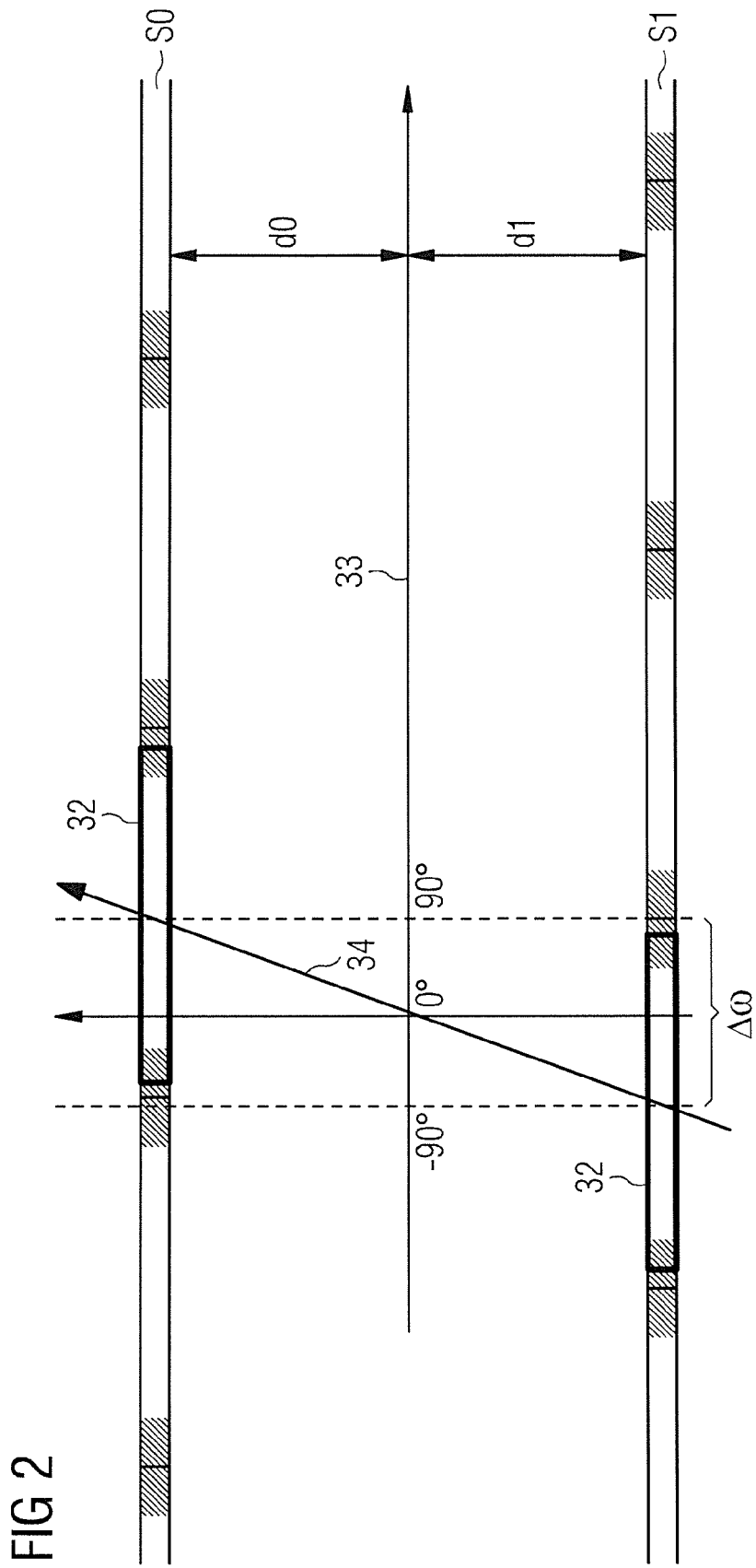
FIG. 2 illustrates the basis of the invention.

FIG. 2 illustrates the basis of the invention. In the situation illustrated in FIG. 2, the isocenter of the basic magnetic field lies at the midpoint between the two slices S0, S1, whose MR signals are to be captured simultaneously, and therefore the two slices S0, S1 have the same distance in numerical terms from the isocenter 32. For example, as a result of a modified CAIPIRINHA method, the frequency bands 32 of the two slices S0, S1 are shifted by 180° relative to each other. It is intended quasi to cancel out this shift by adapting the local Larmor frequency 34 (i.e. by setting the Larmor frequency of the slices S0, S1 correspondingly). This would result in the frequency bands 32 of the two slices S0, S1 lying quasi one above the other, whereby the effective readout bandwidth would have a maximum value.

For the purpose of adapting the local Larmor frequency 34, provision is inventively made for producing an additional gradient moment ΔM, by which the frequency band shift Δω) between the frequency bands 32 of the slices S0, S1 is cancelled out. In other words, the Larmor frequency is increased (decreased) by the additional gradient moment ΔM to an extent that is proportional to the distance from the isocenter 33 in a predefined direction (counter to the predefined direction). In this case, the predefined direction in FIG. 2 points upwardly (from slice S1 to slice S1).

Figure 3:
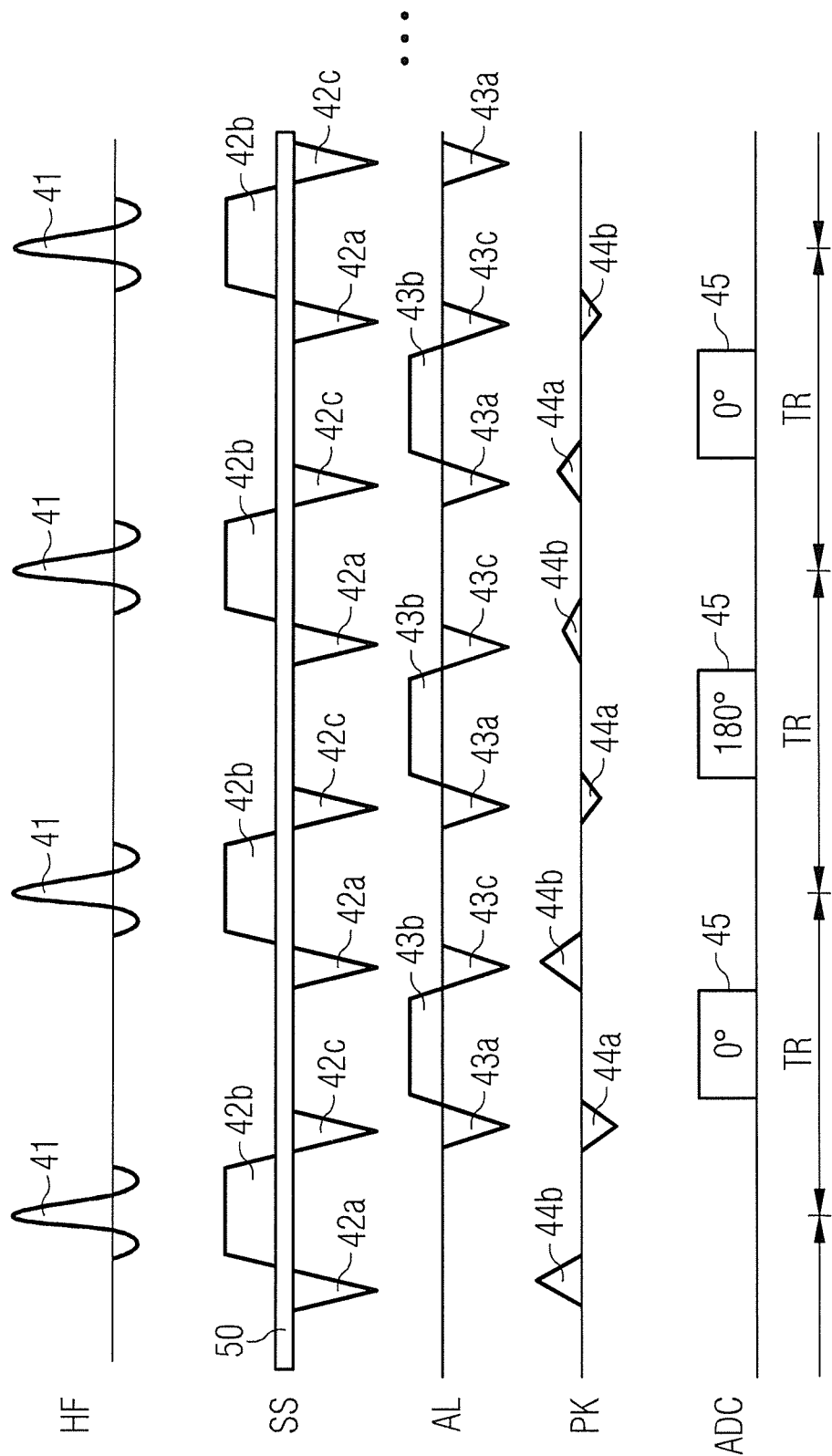
FIG. 3 illustrates a first variant for producing the additional gradient moment according to the invention.

FIG. 3 illustrates a first inventive embodiment variant for producing the additional gradient moment ΔM.

The gradient echo sequence illustrated in FIG. 3 for one of a number of slices to be captured simultaneously has an RF excitation pulse 41, which is applied at the same time as a slice selection gradient 42 is present. After the RF excitation pulse 41, a phase coding gradient 44 and a readout gradient 43 are activated. While the readout gradient 43 is present, the readout of the MR signals takes place during a determined time period 45. The specified number of degrees (0° or 180°) in the respective time period 45 indicates the corresponding phase position of the MR signals.

In the embodiment variant according to FIG. 3, the inventive additional gradient moment is produced by an additional gradient 50 which is constantly present over the time. Since the inventive gradient echo sequence illustrated is a balanced sequence, the gradient moment produced by the gradients 42, 43, 44 in all three spatial directions (i.e. slice selection direction LS, readout direction RO and phase coding direction PC) per repetition time TR is zero. This condition is contravened by the inventive additional gradient 50.

More specifically, the gradient moment produced by the gradient portions 42a and 42c of the slice selection gradient 42 corresponds in size to the gradient moment produced by the gradient portion 42b of the slice selection gradient. Similarly, the gradient moment produced by the gradient portions 43a and 43c of the readout gradient 43 corresponds in size to the gradient moment produced by the gradient portion 43b. The gradient moments produced by the gradient portions 44a, 44b of the phase selection gradient 44 are likewise identical in size.

Figure 4:
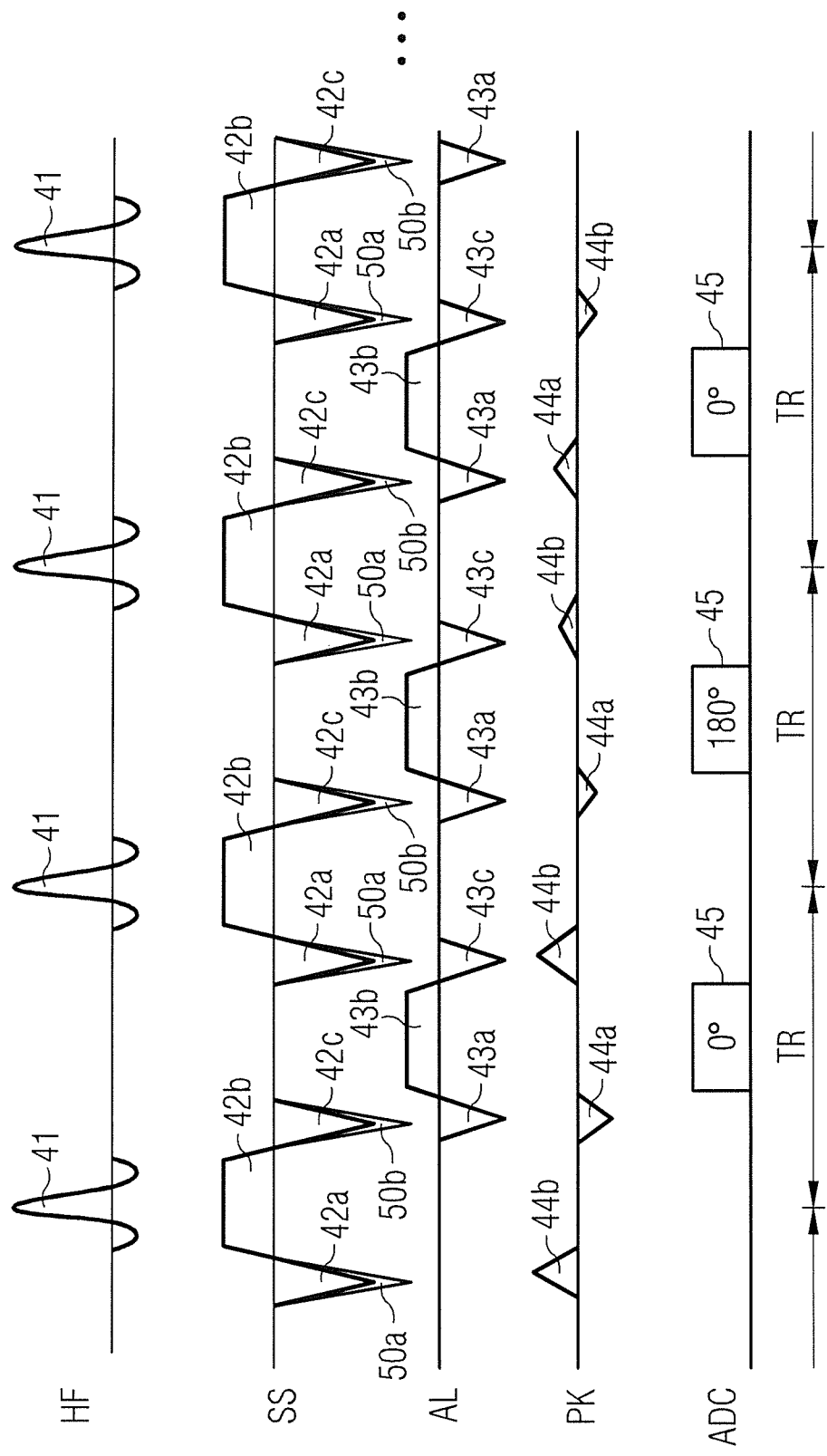
FIG. 4 illustrates a second variant for producing the additional gradient moment according to the invention.

FIG. 4 illustrates a preferred inventive embodiment variant for producing the additional gradient moment.

In contrast to FIG. 3, the additional gradient moment in the embodiment variant illustrated in FIG. 4 is produced by an additional gradient 50, which is only present in the time periods before and after the RF excitation pulse 41, and is therefore not present in the time period during which the RF excitation pulse 41 is applied. It is also the cast that the additional gradient 50 is not present in the time period 45 during which the MR signals are read out. This means that the additional gradient 50 is established only in the so-called prephaser phase and in the so-called rephaser phase of the slice selection gradient 42. In other words, the additional gradient is divided into two portions 50a, 50b in this embodiment variant, the one portion 50a being superimposed on the prephaser portion 42a of the slice selection gradient 42, and the other portion 50b being superimposed on the rephaser portion 42c of the slice selection gradient 42. This embodiment has the advantage that the slice selection by the RF excitation pulse 41 and the readout of the MR signals are not disrupted by the additional gradient 50.

It should be noted that the additional gradient moment produced by the additional gradient 50 is equal in size for each repetition time TR. It is not necessary for the (profile of the) additional gradient(s) to be constant or identical during each repetition time in order to produce the same additional gradient moment during each repetition time TR. It is entirely possible to satisfy the condition that the additional gradient moment must be identical during each repetition time TR by various additional gradients within the respective repetition time TR. In the case of the embodiment variant illustrated in FIG. 4, however, the (profile of the) additional gradient(s) is also identical for all repetition times TR.

Figure 5:
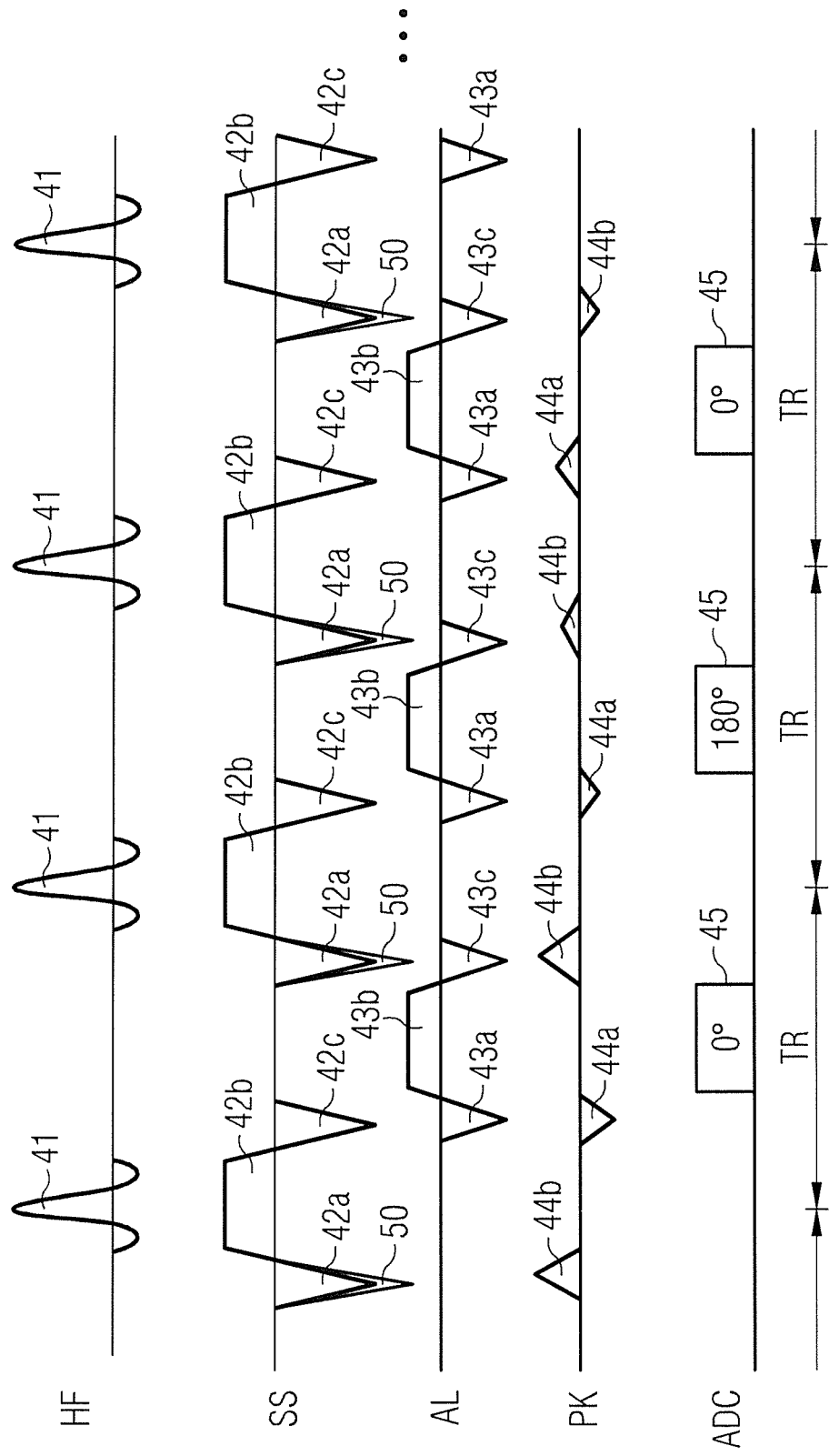
FIG. 5 illustrates a third variant for producing the additional gradient moment according to the invention.

FIG. 5 illustrates a further embodiment variant according to the invention.

In contrast with the embodiment illustrated in FIG. 4, the additional gradient 50 in the embodiment illustrated in FIG. 5 is only activated immediately before the RF excitation pulse 41. This means that in this embodiment variant the additional gradient 50 is activated neither during the RF excitation pulse 41 nor during the readout of the MR signals, nor directly after the RF excitation pulse 41. In other words, the additional gradient 50 is activated only in the so-called prephaser phase of the slice selection gradient 42, such that the additional gradient 50 is only superimposed on the prephaser portion 42a of the slice selection gradient 42.

In this embodiment as well, the additional gradient moment produced per repetition time TR is constant over all repetition times TR. Although this is not necessary (cf. explanation of the embodiment variant illustrated in FIG. 4), the (profile of the) additional gradient(s) 50 is therefore identical for all repetition times TR.

According to a further inventive embodiment (not shown), the additional gradient 50 can also be activated only immediately after the RF excitation pulse 41. This means that in this embodiment variant the additional gradient 50 is switched neither during the RF excitation pulse 41 nor during the readout of the MR signals, nor directly before the RF excitation pulse 41. In other words, the additional gradient 50 is only switched in the so-called rephaser phase of the slice selection gradient 42, such that the additional gradient 50 is only superimposed on the rephaser portion 42c of the slice selection gradient 42.

Figure 6:
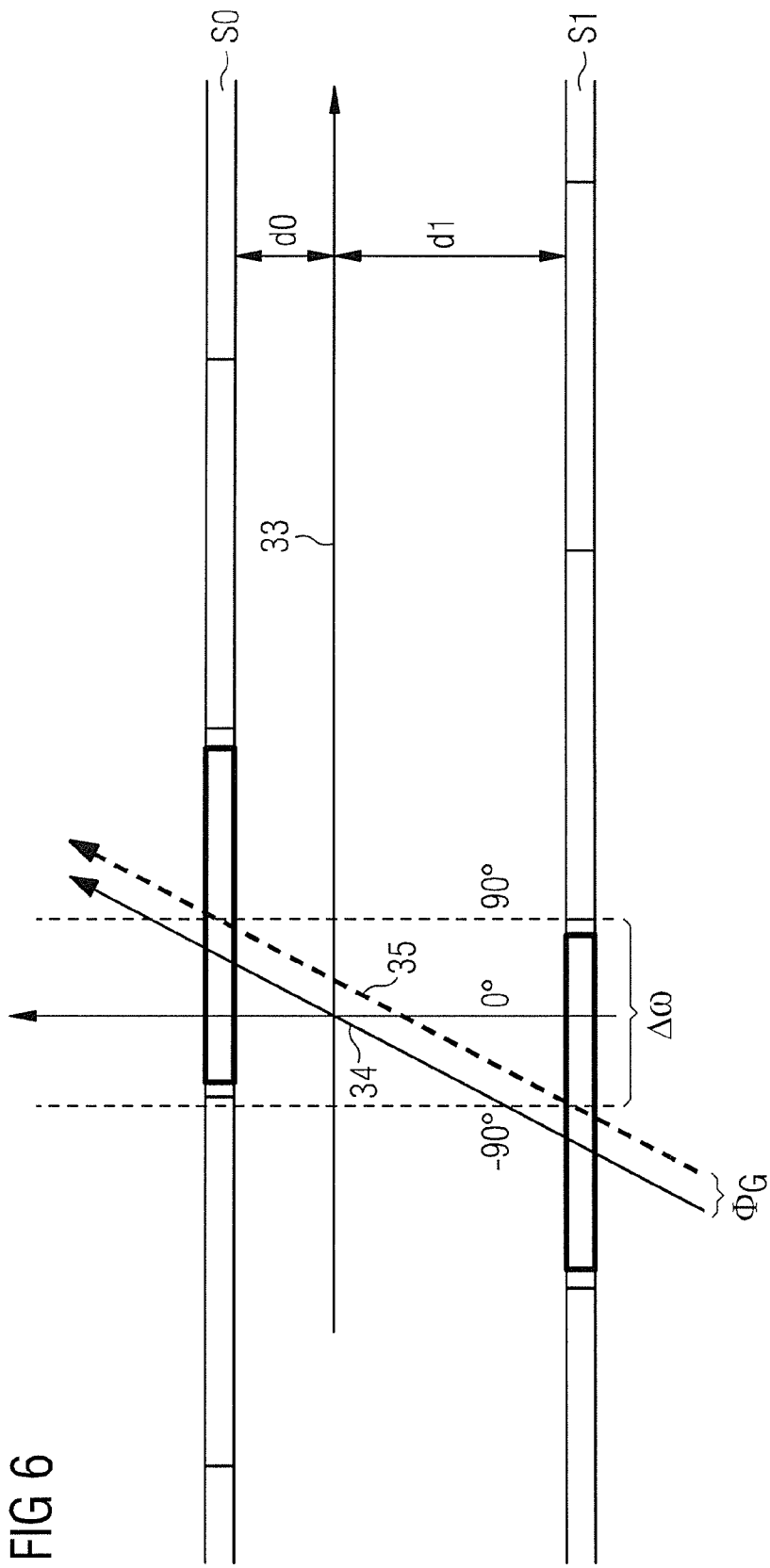
FIG. 6 illustrates a further problem to be solved by the invention.

FIG. 6 illustrates a characteristic feature of the present invention, occurring when the isocenter 33 is not situated at the midpoint between the two slices to be captured simultaneously S0, S1, which is generally the case. In this case, the captured MR signals accumulate an unwanted phase $\Phi_G$ per repetition time TR.

This unwanted phase accumulation $\Phi_G$ per TR can be avoided, specifically by determining this unwanted phase accumulation and then allowing for it when determining both the phase of the excitation pulses and the phase of the receiver. As a result, the captured MR signals no longer exhibit the unwanted phase accumulation $\Phi_G$.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for acquiring magnetic resonance (MR) data from a predetermined volume within an examination object, comprising:

from a control computer, operating said MR scanner in a gradient echo sequence so as to activate a slice selection gradient in a slice selection direction, said slice selection gradient producing a balanced gradient moment;

from said control computer, operating said MR scanner in said gradient echo sequence so as to radiate, simultaneously with activating said slice selection gradient, an RF pulse that simultaneously excites nuclear spins in a plurality of slices of the examination object, with said excitation being repeated according to a repetition time;

from said control computer, operating said MR scanner in said gradient echo sequence so as to vary a phase of MR signals to be acquired from a same one of said plurality of slices from repetition time-to-repetition time;

from said control computer, operating said MR scanner in said gradient echo sequence so as to activate an additional gradient in the slice selection gradient, in addition to said slice selection gradient, said additional gradient producing an additional gradient moment that is constant over consecutive repetition times and that makes gradient moments of the gradient echo sequence unbalanced along said slice selection direction;

from said control computer, operating said MR scanner in said gradient echo sequence so as to activate gradients in respective spatial directions, other than said slice selection direction, that all have gradient moments that are balanced along the respective spatial directions; and from said control computer, operating said MR scanner in said gradient echo sequence so as to activate a readout gradient, as one of said gradients in spatial directions other than said slice selection direction, during which said MR signals are acquired.

2. A method as claimed in claim 1 comprising activating said additional gradient so as to be constant during all repetition times.

3. A method as claimed in claim 2 comprising activating said additional gradient at at least one time selected from the group consisting of before each RF excitation pulse and after each RF excitation pulse.

4. A method as claimed in claim 1 comprising in said control computer, determining said additional gradient moment dependent on at least one of a distance between at least two of the plurality of slices, and a difference in phase increment of said RF excitation pulses of said slices.

5. A method as claimed in claim 4 comprising in said control computer, determining said additional gradient moment ΔM according to:

$$\Delta M = \frac{\Delta P}{\gamma \cdot d},$$

wherein ΔP is the difference in phase increment of the RF excitation pulses of the slices, d is the distance between the slices and γ is the gyromagnetic ratio of said nuclear spins.

6. A method as claimed in claim 1 wherein said MR scanner generates a basic magnetic field during said gradient echo sequence, said basic magnetic field having an isocenter, and wherein a first of said slices has a distance d0 in a predetermined direction from said isocenter and a second of said slices has a distance d1 in said predetermined direction from said isocenter, and wherein a $k^{th}$ RF excitation pulse of said first slice has a phase $P_0(k)$, with $$P_0(k) = -k*90° - k*\Phi_G + \Phi_{C0}$$

and wherein $k^{th}$ RF excitation pulse of the second layer has a phase $P_1(k)$, with $$P_1(k) = +k*90° - k*\Phi_G + \Phi_{C1}$$

wherein $\Phi_{C0}$ is a constant phase of the first slice and $\Phi_{C1}$ is a constant phase of the second slice, wherein $\Phi_G$ is a phase increment that satisfies the equation:

$$\Phi_G = 90° \cdot \frac{(d0 + d1)}{(d0 - d1)}$$

wherein k begins at zero and runs over all rows of the respective slice.

7. A method as claimed in claim 6 wherein a phase $\Phi_E$ of a receiver of the magnetic resonance scanner obeys the following equation in order to acquire said MR signals:

$$\Phi_E = X(k) + k*\Phi0 - k*\Phi_G$$

wherein $X(k)=180°$ if k is an odd number and otherwise $X(k)=0°$.

8. A method as claimed in claim 1 comprising varying the phase of the MR signals to be acquired for each of the slices to be acquired simultaneously.

9. A method as claimed in claim 1 comprising:
varying the phase of the MR signals to be acquired by establishing a further gradient before and after the excitation pulse in the slice selection direction; and
activating said further gradient before a respective RF excitation pulse with a gradient moment that corresponds to a gradient moment produced by the further gradient moment activated after the respective RF excitation pulse, and with the gradient moment produced by the further gradient varying over consecutive repetition times.

10. A method as claimed in claim 9 wherein said gradient moment produced by the further gradient in a first repetition time corresponds to a negative further gradient moment produced by the further gradient in a second repetition time that directly follows said first repetition time.

11. A method as claimed in claim 1 comprising varying the phase of the MR signals to be acquired by varying the phase of the RF excitation pulses that excite a same one of said slices.

12. A method as claimed in claim 11 comprising varying the phase of the RF excitation pulses for each of the slices.

13. A magnetic resonance (MR) apparatus comprising:
an MR data acquisition scanner;
a control computer configured to operate said MR scanner in a gradient echo sequence so as to activate a slice selection gradient in a slice selection direction, said slice selection gradient producing a balanced gradient moment;
said control computer being configured to operate said MR scanner in said gradient echo sequence so as to radiate, simultaneously with activating said slice selection gradient, an RF pulse that simultaneously excites nuclear spins in a plurality of slices of the examination object, with said excitation being repeated according to a repetition time;
said control computer being configured to operate said MR scanner in said gradient echo sequence so as to vary a phase of MR signals to be acquired from a same one of said plurality of slices from repetition time-to-repetition time;
said control computer being configured to operate said MR scanner in said gradient echo sequence so as to activate an additional gradient in the slice selection gradient, in addition to said slice selection gradient, said additional gradient producing an additional gradient moment that is constant over consecutive repetition times and that make gradient moments of the gradient echo sequence unbalanced along said slice selection direction;
said control computer being configured to operate said MR scanner in said gradient echo sequence so as to activate gradients in respective spatial directions, other than said slice selection direction, that all have gradient moments that are balanced along the respective spatial directions; and
said control computer being configured to operate said MR scanner in said gradient echo sequence so as to activate a readout gradient, as one of said gradients in spatial directions other than said slice selection direction, during which said MR signals are acquired.

14. A non-transitory, computer-readable data storage medium encoded with programming instructions, said storage medium being loaded into a control computer of a magnetic resonance (MR) apparatus that comprises an MR data acquisition scanner, said programming instructions causing said control computer to:
operate said MR scanner in a gradient echo sequence so as to activate a slice selection gradient in a slice selection direction, said slice selection gradient producing a balanced gradient moment;
operate said MR scanner in said gradient echo sequence so as to radiate, simultaneously with activating said slice selection gradient, an RF pulse that simultaneously excites nuclear spins in a plurality of slices of the examination object, with said excitation being repeated according to a repetition time;
operate said MR scanner in said gradient echo sequence so as to vary a phase of MR signals to be acquired from a same one of said plurality of slices from repetition time-to-repetition time;
operate said MR scanner in said gradient echo sequence so as to activate an additional gradient in the slice selection gradient, in addition to said slice selection gradient, said additional gradient producing an additional gradient moment that is constant over consecutive repetition times and that make gradient moments of the gradient echo sequence unbalanced along said slice selection direction;
overate said MR scanner in said gradient echo sequence so as to activate gradients in respective spatial directions, other than said slice selection direction, that all have gradient moments that are balanced along the respective spatial directions; and
operate said MR scanner in said gradient echo sequence so as to activate a readout gradient, as one of said gradients in spatial directions other than said slice selection direction, during which said MR signals are acquired.

* * * * *